United States Patent
Kushta

(10) Patent No.: US 8,994,480 B2
(45) Date of Patent: Mar. 31, 2015

(54) RESONANT ELEMENTS DESIGNED VERTICALLY IN A MULTILAYER BOARD AND FILTERS BASED ON THESE ELEMENTS

(75) Inventor: Taras Kushta, Tokyo (JP)

(73) Assignee: NEC Corporation, Tokyo (JP)

( * ) Notice: Subject to any disclaimer, the term of this patent is extended or adjusted under 35 U.S.C. 154(b) by 381 days.

(21) Appl. No.: 13/386,009

(22) PCT Filed: Jul. 21, 2009

(86) PCT No.: PCT/JP2009/063315
§ 371 (c)(1),
(2), (4) Date: Jan. 19, 2012

(87) PCT Pub. No.: WO2011/010393
PCT Pub. Date: Jan. 27, 2011

(65) Prior Publication Data
US 2012/0119853 A1      May 17, 2012

(51) Int. Cl.
*H01P 1/203* (2006.01)
*H01P 7/04* (2006.01)
(Continued)

(52) U.S. Cl.
CPC ............. *H01P 1/20345* (2013.01); *H01P 7/04* (2013.01); *H05K 1/0251* (2013.01);
(Continued)

(58) Field of Classification Search
CPC ... H01P 1/20345; H01P 1/2056; H01P 7/085; H01P 7/082; H01P 7/04; H05K 1/0251; H05K 1/0222; H05K 1/116; H05K 3/429; H05K 2201/09381; H05K 2201/09454; H05K 2201/09618; H05K 2201/09718

USPC ......... 333/176, 204, 219, 238, 246, 255, 206, 333/207, 222, 223
See application file for complete search history.

(56) References Cited

U.S. PATENT DOCUMENTS 6,091,312 A * 7/2000 Sheen .......................... 333/176
7,705,695 B2   4/2010 Kushta
(Continued)

FOREIGN PATENT DOCUMENTS

CN           1989650 A     6/2007
CN         102265456 A    11/2011
(Continued)

OTHER PUBLICATIONS

Chinese Office Action dated Sep. 4, 2013, with English translation.
(Continued)

*Primary Examiner* — Benny Lee
*Assistant Examiner* — Jorge Salazar, Jr.
(74) *Attorney, Agent, or Firm* — McGinn IP Law Group, PLLC

(57) ABSTRACT

A resonant element is provided with a multilayer board, comprising a plurality of conductor layers isolated by a dielectric, a signal via conductor, penetrating through the multilayer board, and a plurality of ground vias, penetrating thought the multilayer board and disposed around the signal via conductor. The multilayer board comprises a first conductor layer, a second conductor layer, and a corrugated conductor layer disposed between the first and the second conductor layers. The corrugated conductor layer comprises a corrugated signal plate, connected to the signal via conductor, and a corrugated ground plate, connected to the plurality of ground vias, isolated from the corrugated signal plate by the dielectric.

18 Claims, 25 Drawing Sheets

(51) Int. Cl.
  *H05K 1/02* (2006.01)
  *H01P 1/205* (2006.01)
  *H05K 1/11* (2006.01)
  *H05K 3/42* (2006.01)

(52) U.S. Cl.
  CPC ........... *H01P 1/2056* (2013.01); *H05K 1/0222* (2013.01); *H05K 1/116* (2013.01); *H05K 3/429* (2013.01); *H05K 2201/09381* (2013.01); *H05K 2201/09454* (2013.01); *H05K 2201/09618* (2013.01); *H05K 2201/09718* (2013.01)
  USPC .......................................... 333/204; 333/222

(56) References Cited

U.S. PATENT DOCUMENTS

2007/0080760 A1  4/2007  Alford
2008/0093112 A1  4/2008  Kushta
2010/0096174 A1  4/2010  Nakano et al.
2011/0248800 A1  10/2011  Kushta

FOREIGN PATENT DOCUMENTS

| | | |
|---|---|---|
| JP | 10-303618 A | 11/1998 |
| JP | 3464117 B2 | 11/2003 |
| JP | 2007-158675 A | 6/2007 |
| JP | 2008-507858 A | 3/2008 |
| WO | WO 2006/009274 A1 | 1/2006 |
| WO | WO 2008/133010 A1 | 11/2008 |

OTHER PUBLICATIONS

International Search Report (ISR) (PCT Form PCT/ISA/210) for PCT/JP2009/063315, dated Oct. 27, 2009.

* cited by examiner

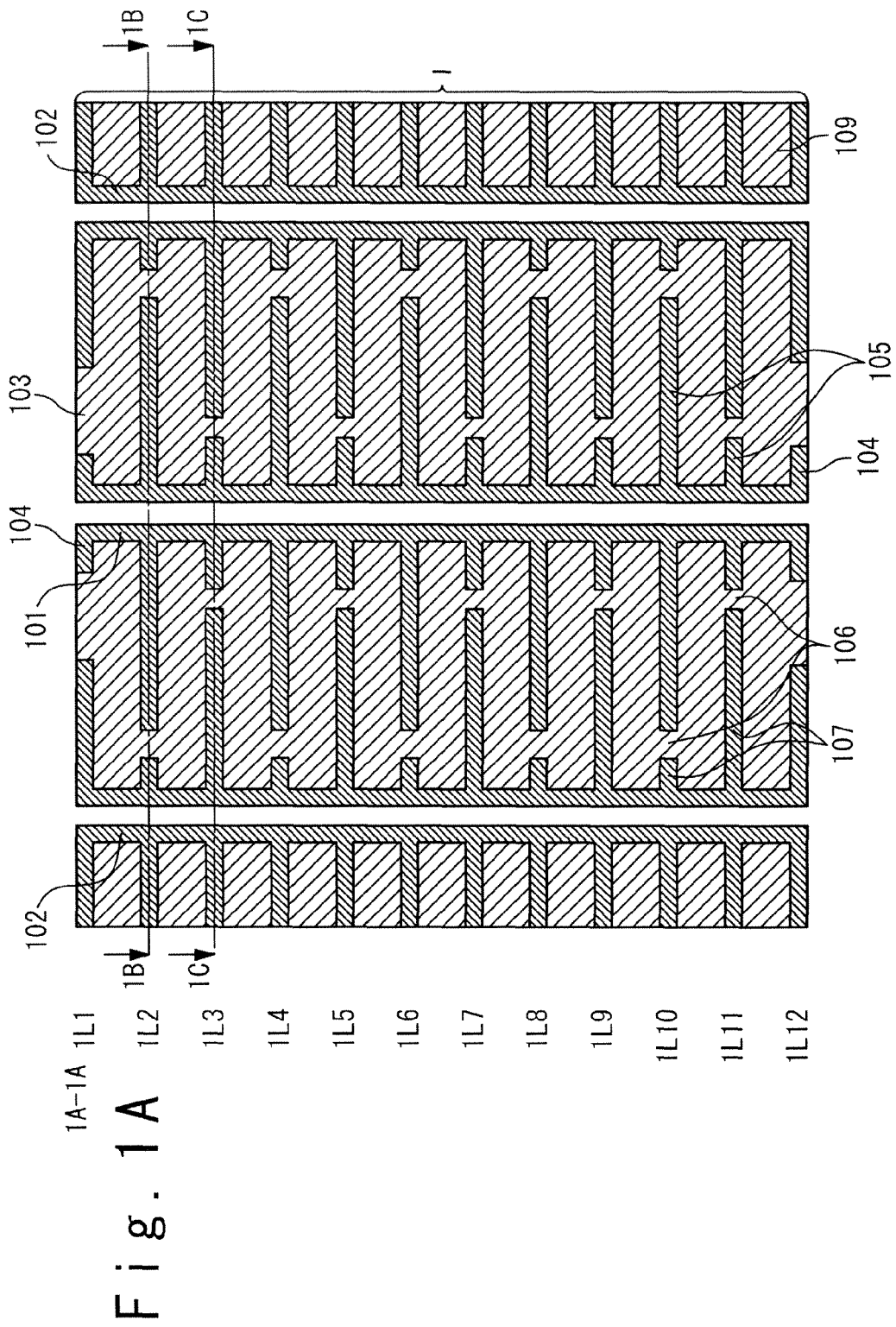

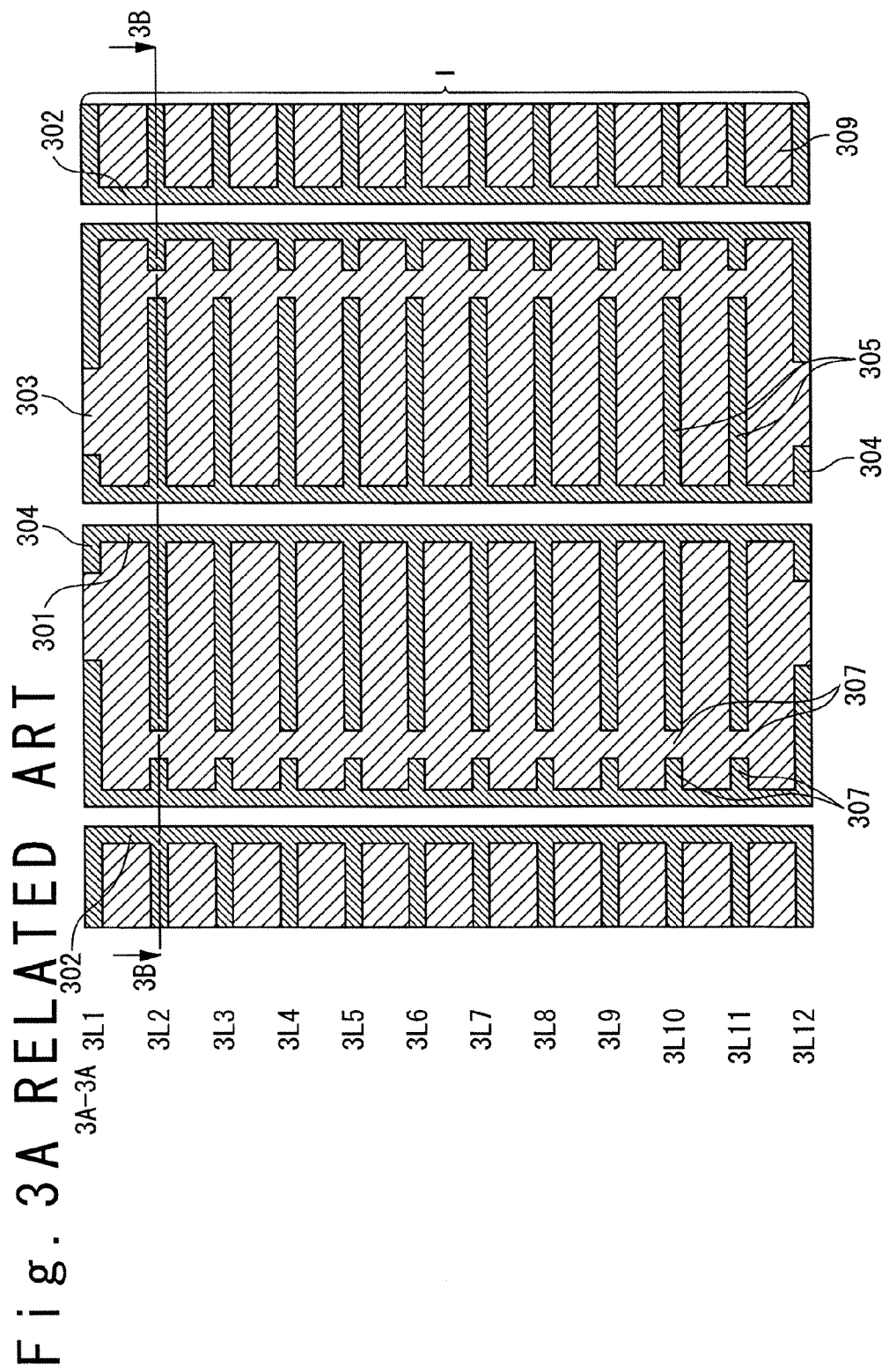

US 8,994,480 B2

RESONANT ELEMENTS DESIGNED VERTICALLY IN A MULTILAYER BOARD AND FILTERS BASED ON THESE ELEMENTS

TECHNICAL FIELD

The present application claims priority to 371 PCT Patent Application No. PCT/JP2009/063315, filed on Jul. 21, 2009, the entire content of which is incorporated herein by reference.

BACKGROUND ART

Miniaturization and cost-effectiveness are key directions in development of modern and next-generation networking and computing systems. Multilayer boards serve as main interconnect technologies in electronics devices constructed by means of chip, package and printed circuit board components. Besides that, interconnections are a base in forming passive components. Open-circuited and short-circuited planar transmission line segments of different forms and dimensions act as stubs, resonators, and other elements of passive components. A reason why the transmission lines have been used for such purposes is that these structures are well waveguiding structures which can provide operation on a fundamental mode (for example, TEM or Quasi-TEM) with defined propagation constant and characteristic impedance in a wide frequency band.

Via structures formed by signal and ground vias conjointly can be not only vertical interconnections between planar transmission lines disposed at different conductor layers of the multilayer board but also as building blocks of passive components.

Japanese Laid Open Application JP 2008-507858 (US 2008/0093112A1) discloses composite via structures which can be used to design both open-circuited and short-circuited stubs and, as result, compact filtering components based on multilayer boards.

However, further dimensional reductions of passive components including filtering structures are necessary in a cost-effective manner for their application in next-generation computing and networking systems.

Also, it is important to obtain methods which can be used to control a bandwidth of filters.

CITATION LIST

Patent Literature: Japanese Laid Open Application JP 2008-507858 (US 2008/0093112A1).

SUMMARY OF INVENTION

It is an object of the present invention to provide compact resonant elements in a multilayer board by means of via structures.

In an aspect of the present invention, such a resonant element is provided by forming a specific coaxial transmission line structure in a multilayer board. In this specific coaxial transmission line, inner and outer conductive boundaries are constructed as followings. The inner conductive boundary comprises a signal via and conductive plates connected to the signal via, wherein conductive plates have corrugated edges. The outer conductive boundary of the coaxial transmission line comprises ground vias and ground conductive plates connected to ground vias. Edges of ground conductive plates disposed in the area between signal and ground vias are corrugated. As result, signal and ground plates disposed at the same conductor layer form double corrugated surface in which signal and ground parts are separated by an isolating slit.

Due to such double corrugations at the conductive layers in the area between signal and ground vias, the effective relative permittivity with the magnitude larger than the relative permittivity of the board isolating material is established and, as result, resonant conditions are achieved in a short via structure segment.

It is another object of this invention to provide open-circuited and short-circuited resonant stubs, resonators, and filtering components, using invented resonant elements, as a result, to reduce their transverse dimensions.

BRIEF DESCRIPTION OF DRAWINGS

FIG. 1A is a vertical cross-sectional view illustrating a resonant element in an exemplary embodiment of the present invention;

FIG. 3A is a vertical cross-sectional view illustrating another relating art structure;

DESCRIPTION OF EMBODIMENTS

Figure 1B:
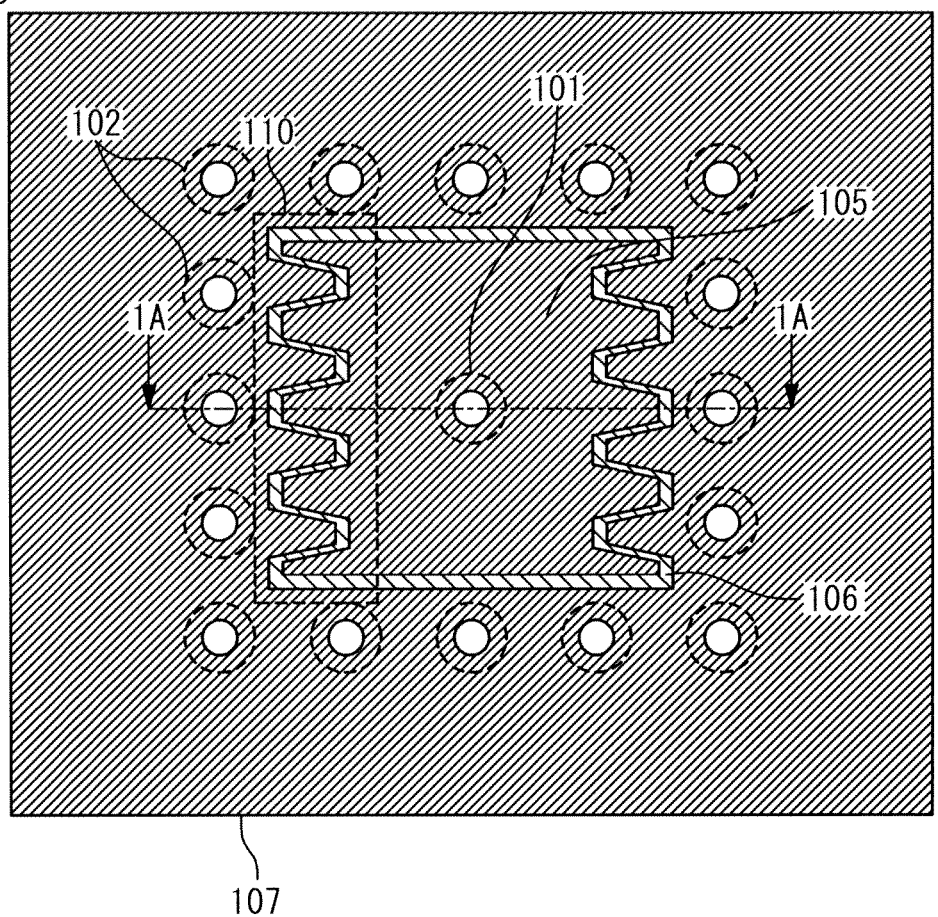
FIG. 1B is a horizontal cross-sectional view of the resonant element shown in FIG. 1A on the 1B section.
Figure 1C:
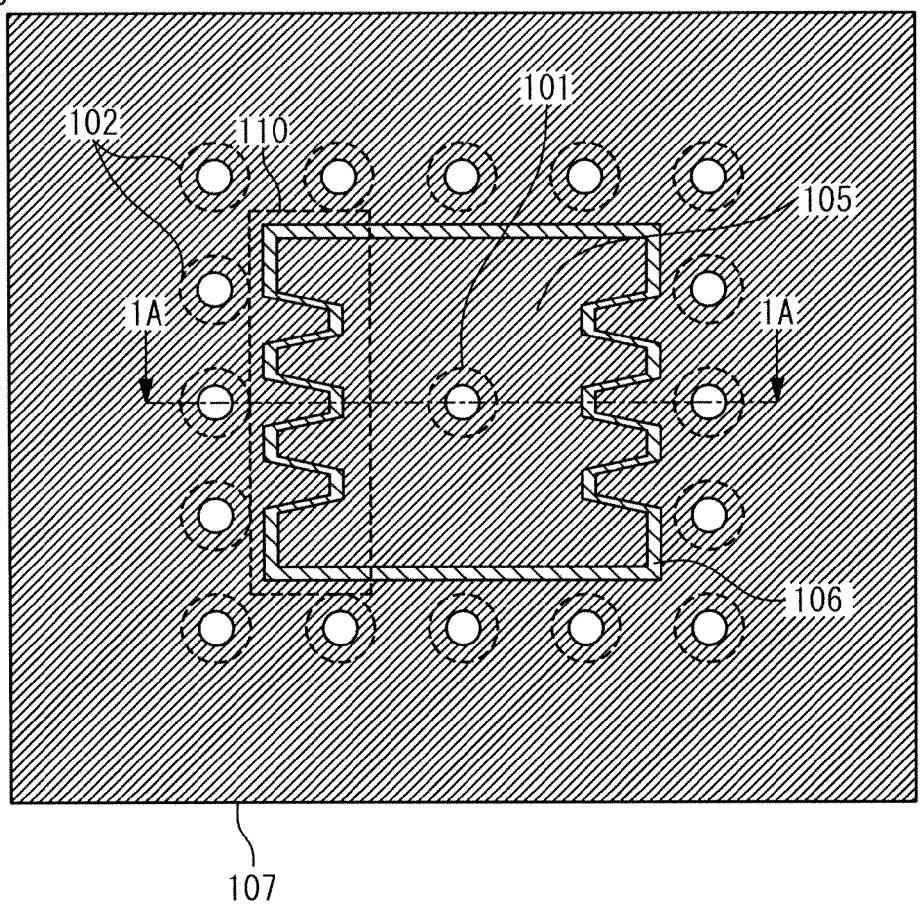
FIG. 1C is a horizontal cross-sectional view of the resonant element shown in FIG. 1A on the 1C section.
Figure 1D:
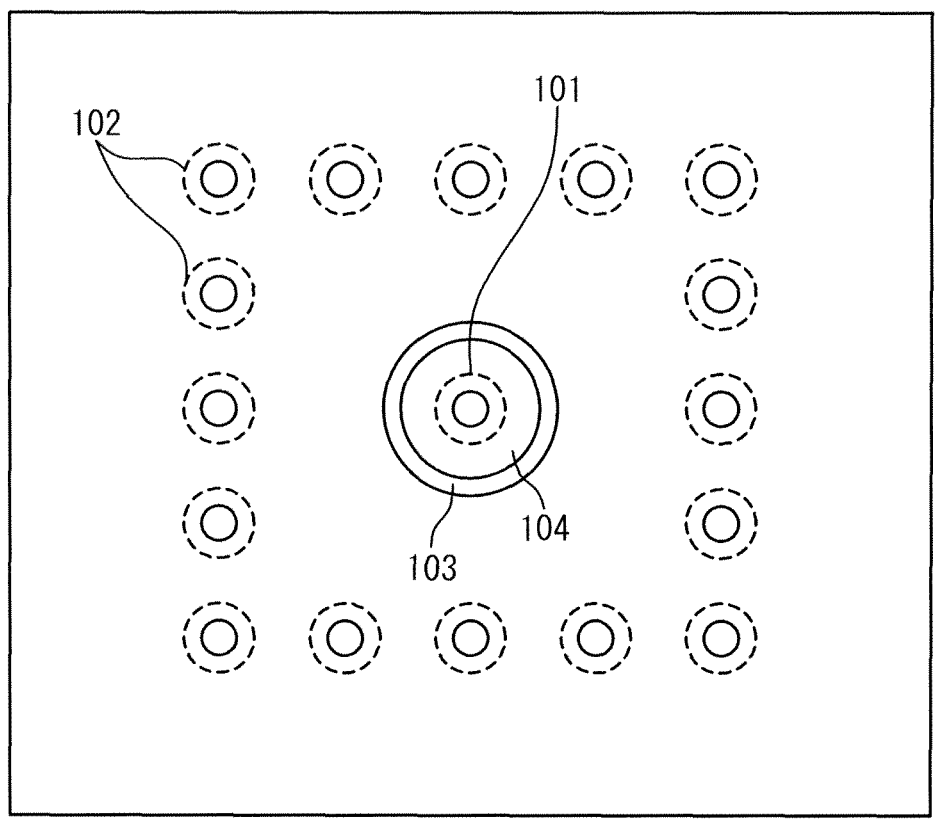
FIG. 1D is top and bottom views of the resonant element shown in FIG. 1A.

Hereinafter, several types of resonant elements, short-circuited and open-circuited stubs, and filters based on these resonant elements disposed in multilayer boards according to the present invention will be described in detail with reference to attached drawings. But, it would be well understood that this description should not be viewed as narrowing the appended claims.

In FIGS. 1A to 1D, an exemplary embodiment of a resonant element in a twelve-conductor-layer board is shown.

It should be noted that this twelve conductor layer board is only an example of multilayer boards and a number of conductor layers, filling material and other board parameters can be different that depends on applications.

In present exemplary embodiment, the resonant element is disposed in the vertical direction from the pad 104 at the top conductor layer of the 12-conductor-layer board to pad 104 of the bottom layer of this board. Conductor layers 1L1, 1L2, 1L3, 1L4, 1L5, 1L6, 1L7, 1L8, 1L9, 1L10, 1L11, and 1L12 are isolated by a dielectric 109. The resonant element comprises a signal via 101 surrounded by ground vias 102, pads 104 isolated from other conductors by clearance area 103 and a double corrugated surface 110. This double corrugated surface 110 is formed in the area between the signal via 101 and ground vias 102 and comprises a corrugated signal plate 105 connected to the signal via 101 and a corrugated ground plate 107 connected to ground vias 102. The signal plate 105 is separated from ground plate 107 by an isolating slit 106 in the double corrugated surface 110.

In fixed multilayer board, the resonant frequency is dependent on dimensions of both signal and ground corrugated conductive plates in the area between signal and ground vias and number of conductive layers in which double corrugated surfaces 110 are formed.

Consider physical mechanisms which are in the base of invented resonant elements. If there are no conductive plates in the area between signal and ground vias, then such structure acts as a coaxial transmission line disposed vertically in a multilayer board. In this coaxial transmission line, the inner conductive boundary is the signal via while ground vias connected to the ground planes act as the outer conductive boundary.

The relative permittivity, $\epsilon_r$, of a material filling area between inner and outer conductive boundary in this transmission line can be defined as following:

$$\epsilon_r = C/(2 \cdot \pi \cdot F(a, b)) \qquad (1)$$

where C is the capacitance per unit length, F(a, b) is a function of the transverse dimensions of the inner conductive boundary and the distance between inner conductive boundary and outer conductive boundary.

To form the resonant element, the length, l, of the coaxial line transmission line segment (shown in FIG. 1A) has to satisfy following condition:

$$l = (n \cdot \pi \cdot \lambda_0)/(2\sqrt{\epsilon_r}) \qquad (2)$$

where n is an integer number, $\lambda_0$ is wavelength in free space.

As one can conclude from Eq. 2, the reduction of the resonant element length can be achieved, if the relative permittivity of the filling material will be increased. In this invention it has been obtained by the creation of an artificial medium in the area between inner and outer conductive boundaries of the coaxial transmission line. This artificial medium is obtained by means of the double-corrugated surface at conductor layers of the multilayer board. Due to this double-corrugated surface, the effective capacitance, $\epsilon_{eff}$, between inner and outer conductive boundaries increases and, as result, the effective permittivity, $\epsilon_{eff}$, of the artificial medium between these boundaries is increased.

Obtained effect can be traced by following equation:

$$\epsilon_{eff} = C_{eff}/(2 \cdot \pi \cdot F(a, b)) \qquad (3)$$

As result, the length of the resonant element in the case of the double-corrugated surface can be defined as:

$$l = (n \cdot \pi \cdot \lambda_0)/(2\sqrt{\epsilon_{eff}}) \qquad (4)$$

Thus as follows from Eq. 4, the increase of the effective permittivity of the filling medium in the coaxial transmission line gives the shorter length of the resonant element, that is, its more compact dimensions.

To show advantages of invented resonant elements full-wave simulations for typical configurations were carried out by the Finite-Difference Time-Domain (FDTD) technique.

These configurations include two cases of relating art structures and one case of the resonant element of present invention.

Consider these cases in details.

Figure 2A:
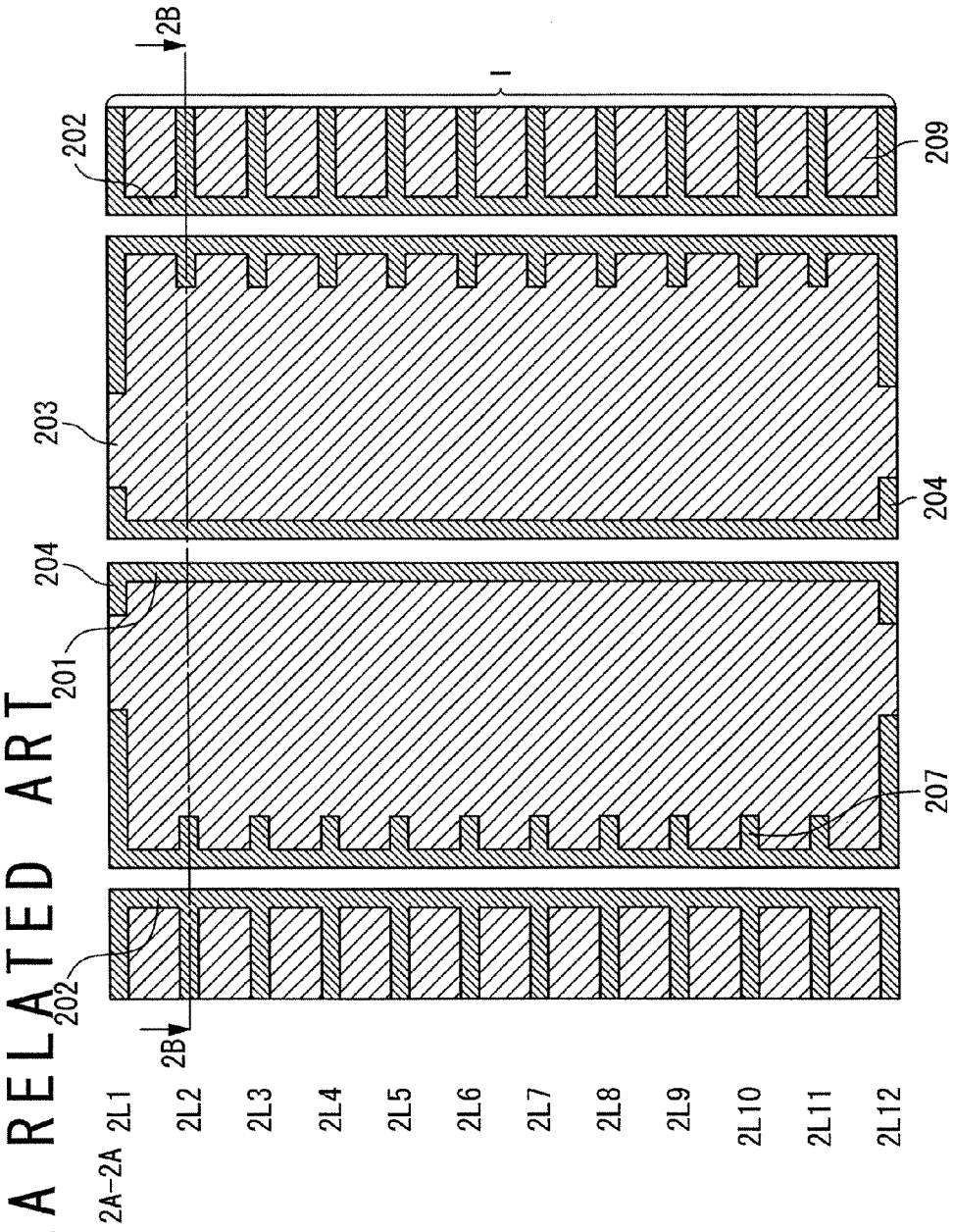
FIG. 2A is a vertical cross-sectional view illustrating a relating art structure.
Figure 2B:
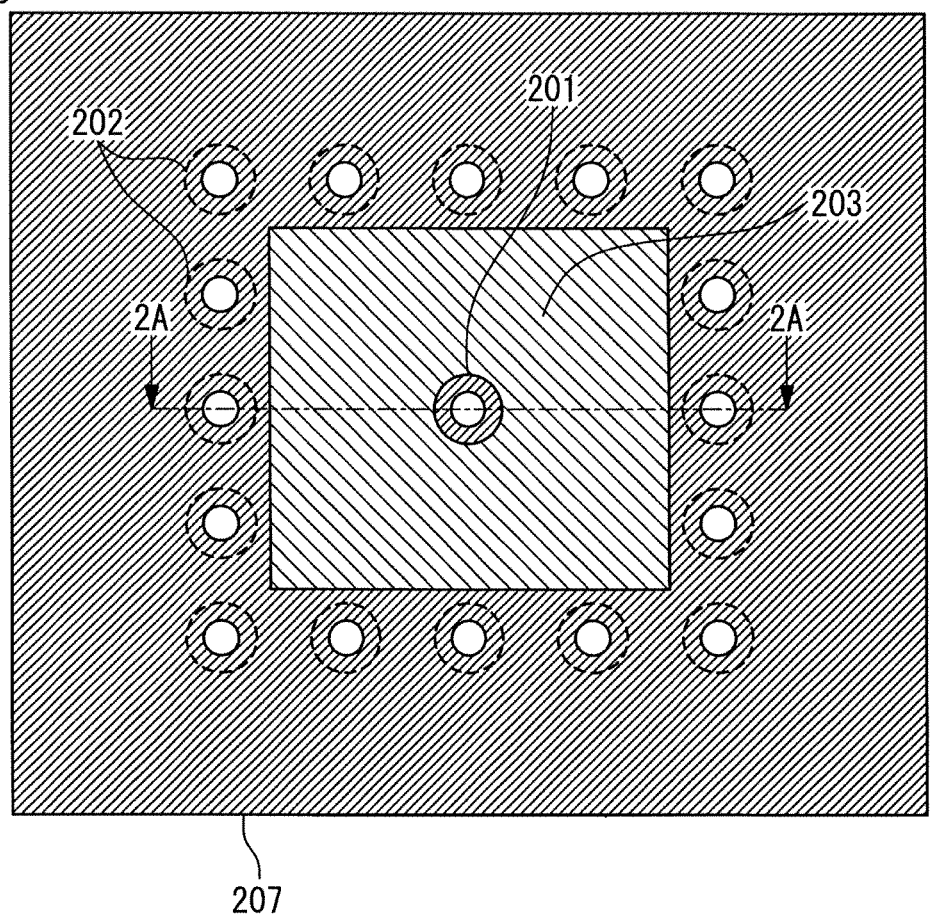
FIG. 2B is a horizontal cross-sectional view of the relating art structure shown in FIG. 2A on the 2B section.
Figure 2C:
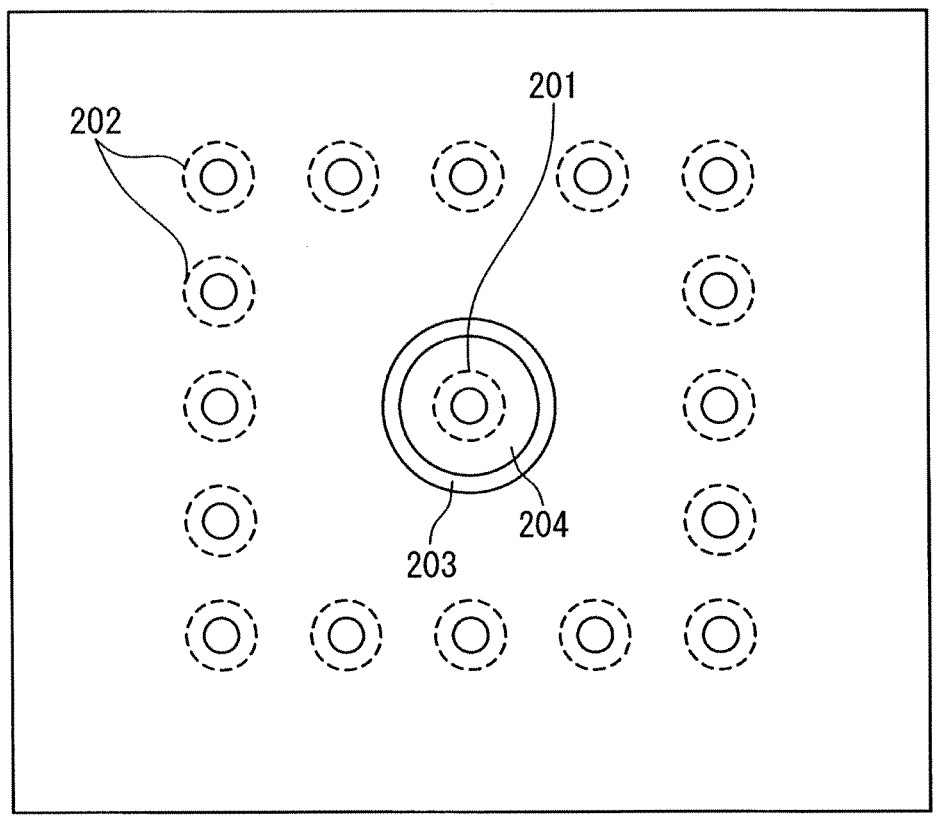
FIG. 2C is top and bottom views of the relating art structure shown in FIG. 2A.

In FIGS. 2A to 2C, the coaxial transmission line of the length l in the twelve-conductor-layer board is shown. This transmission line comprises a signal via conductor 201, ground vias 202 connected to ground plates 207, pads 204 connected to the signal via conductor 201, and clearance area 203 isolating signal conductors from ground conductors. Conductor layer in the board are isolated by a dielectric 209.

Figure 3B:
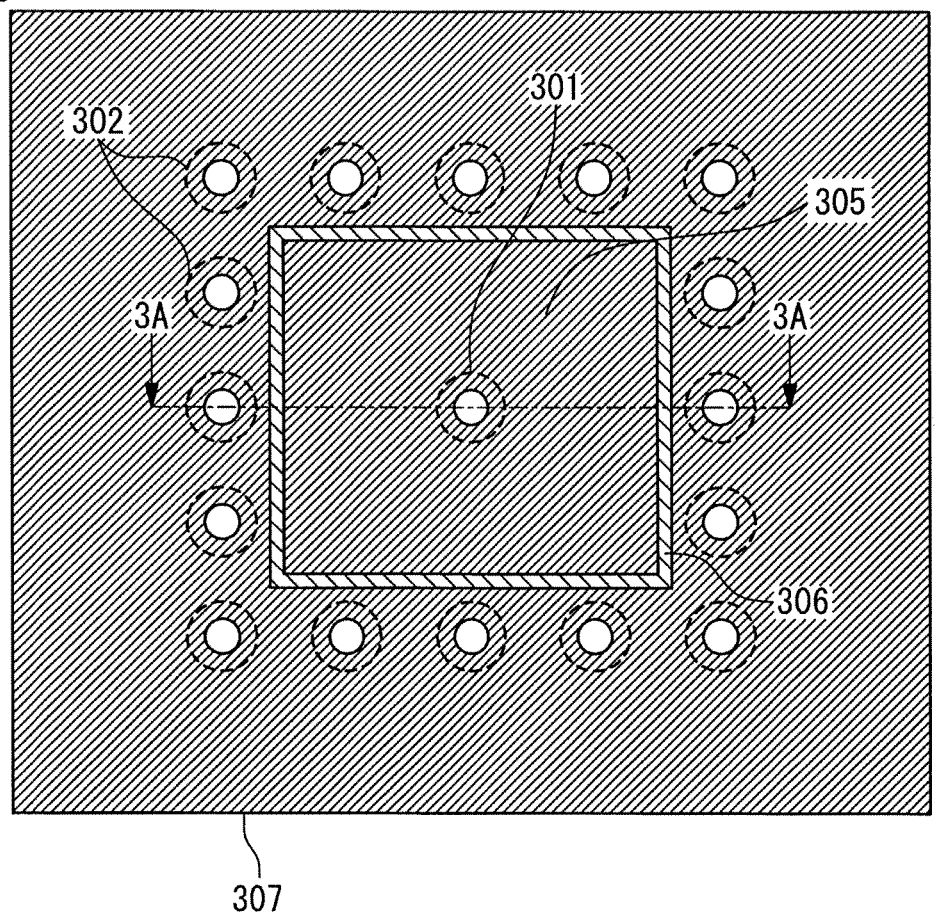
FIG. 3B is a horizontal cross-sectional view of the relating art structure shown in FIG. 3A on the 3B section.
Figure 3C:
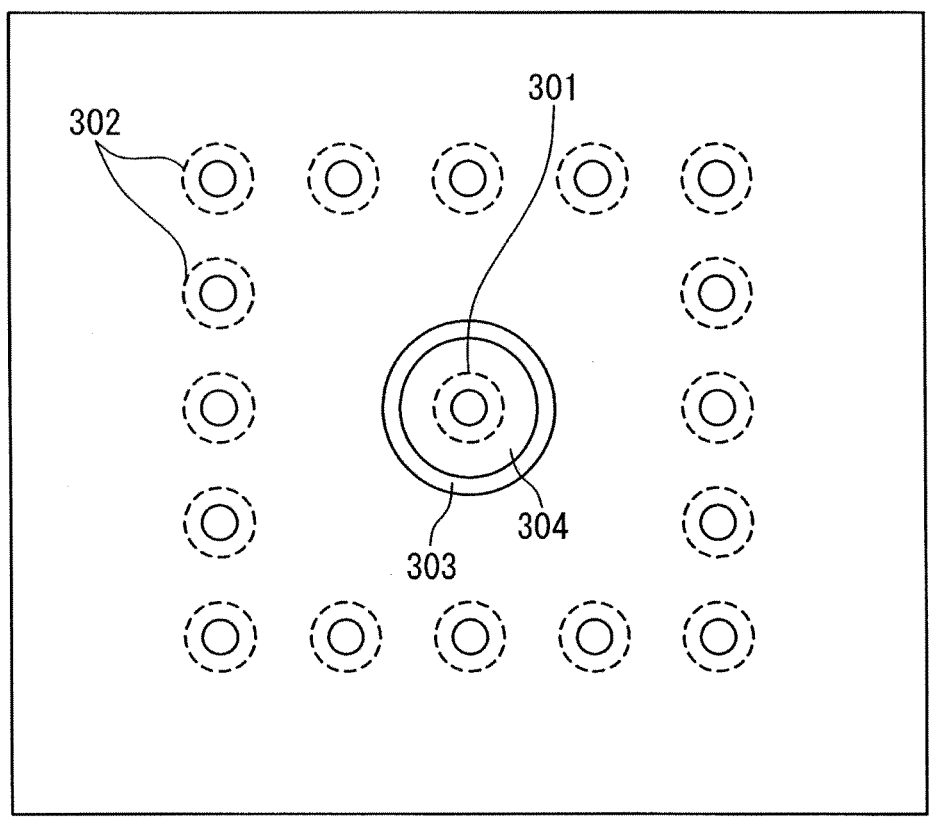
FIG. 3C is top and bottom views of the relating art structure shown in FIG. 3A.

Another relating art structure is shown in FIGS. 3A to 3C. This structure presents the coaxial transmission line of the length l in the twelve-conductor-layer board. Similarly to above-mentioned case of the relating art, the coaxial transmission line comprises a signal via conductor 301, ground vias 302 connected to ground plates 307, pads 304 connected to the signal via conductor 301, and clearance area 303 isolating signal conductors from ground conductors. However in this case, additional conductor plates 305 are connected to signal via conductor 301 at conductor layers. These plates 305 are isolated from ground conductors by isolating slits 306.

Figure 4A:
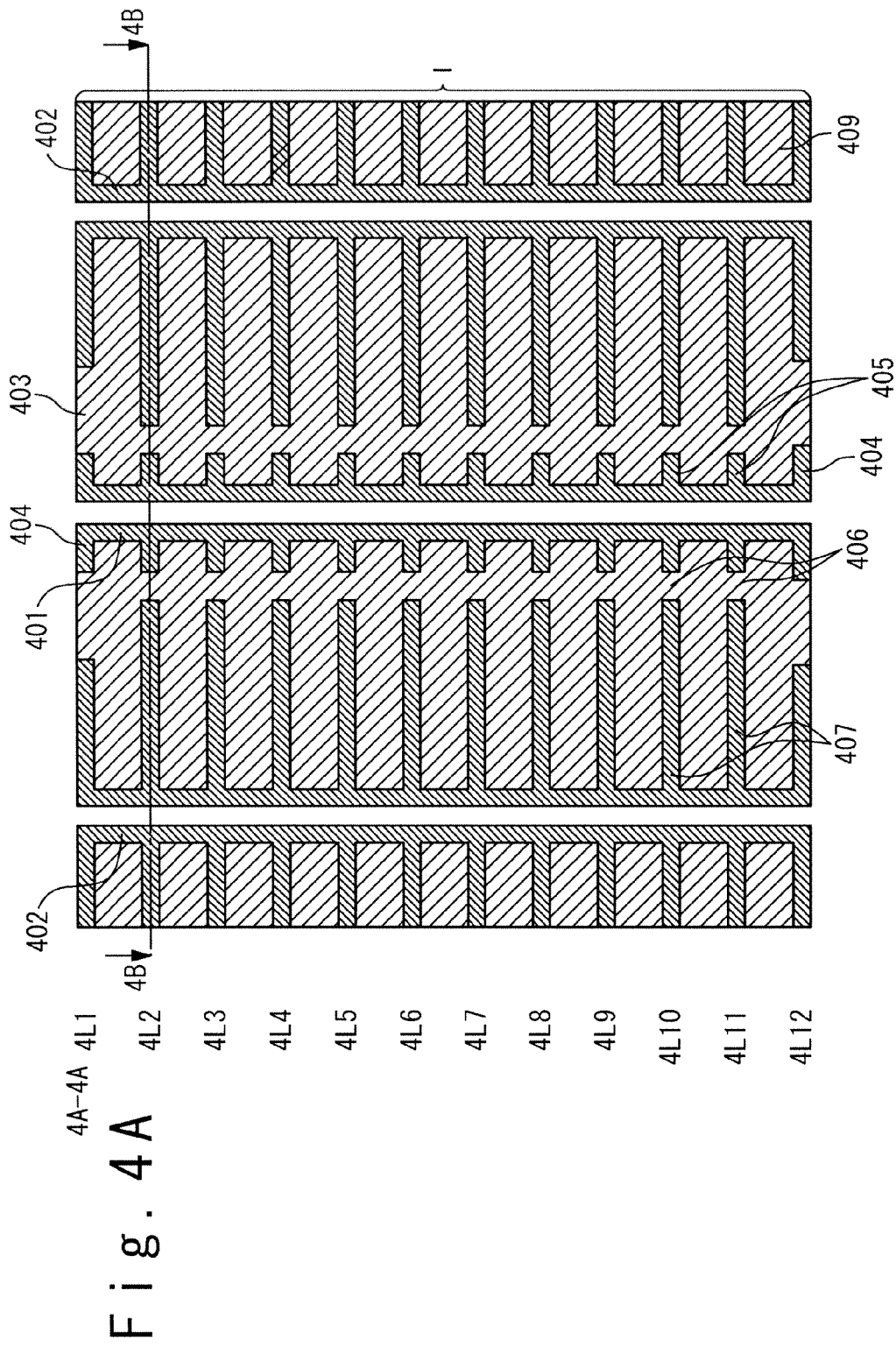
FIG. 4A is a vertical cross-sectional view illustrating a resonant element in another exemplary embodiment of the present invention.
Figure 4B:
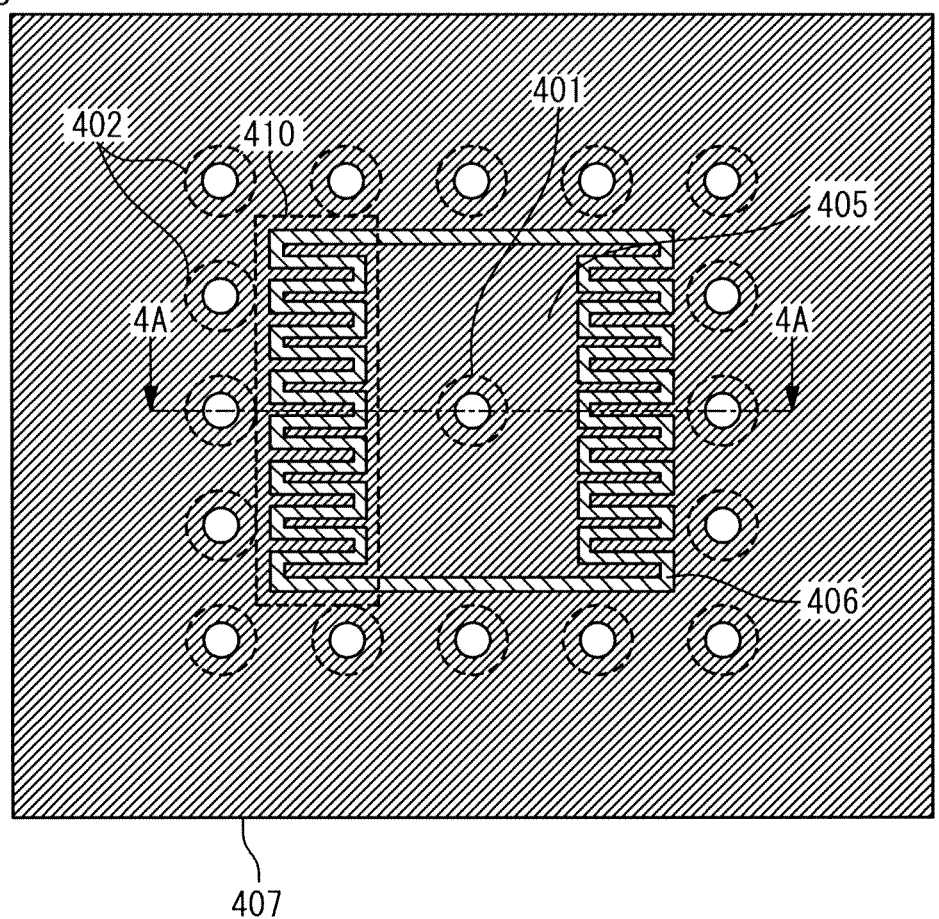
FIG. 4B is a horizontal cross-sectional view of the resonant element shown in FIG. 4A on the 4B section.
Figure 4C:
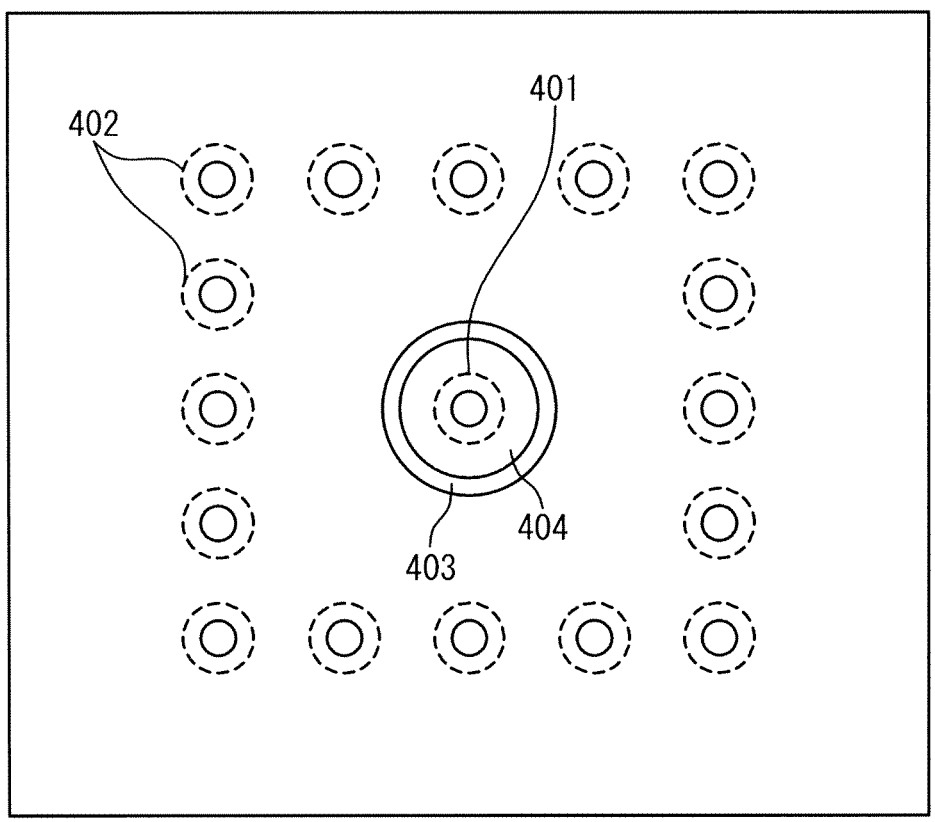
FIG. 4C is top and bottom views of the resonant element shown in FIG. 4A.

The resonant element of present invention is shown in FIGS. 4A to 4C. This resonant element is formed as a segment of the coaxial transmission line comprising a signal via conductor 401, ground vias 402 connected to ground plates 407, pads 404 connected to the signal via conductor 401, and clearance area 403 isolating signal conductors from ground conductors. In this resonant element, the double corrugated surface is formed in the area between signal via conductor and ground vias by the signal corrugated plate 405 and ground corrugated plate 407 which are separated by an isolating slit 406.

Dimensions of three considered structures were as following: the thickness of the twelve-conductor-layer board was 2.944 mm; the thickness of copper conductor layers was 0.035 mm; the diameter of the signal via conductor was 0.65 mm; the pad diameter was 0.95 mm; ground vias in the structures were arranged as the square with the side of 3.32 mm; conductive plates connected to the signal via had the square form with the side of 2.8 mm; the isolating slits separating these plates from the ground conductors had the width of 0.1 mm; the ground plate corrugations had the rectangular form with the depth of 0.8 mm and width of 0.3 mm; the signal plate corrugations had the rectangular form with the depth of 0.8 mm and width of 0.3 mm.

Figure 5:
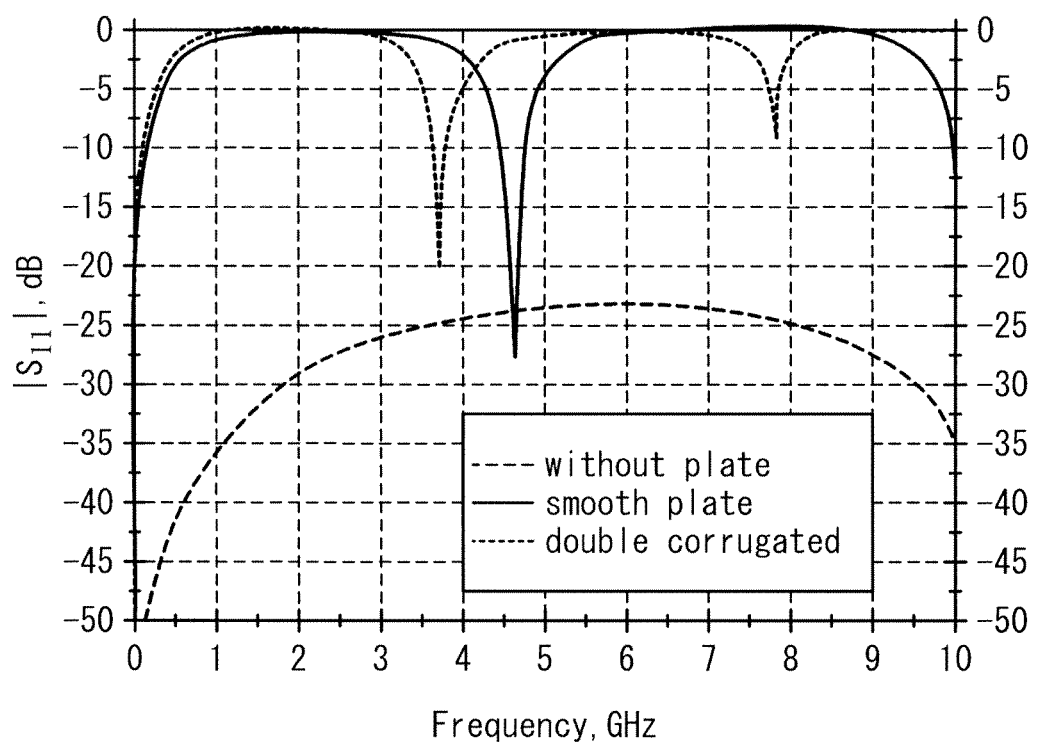
FIG. 5 is a graph showing the effect of the double-corrugated plates on the electrical performance of the resonant element by means of simulated return losses.
Figure 6:
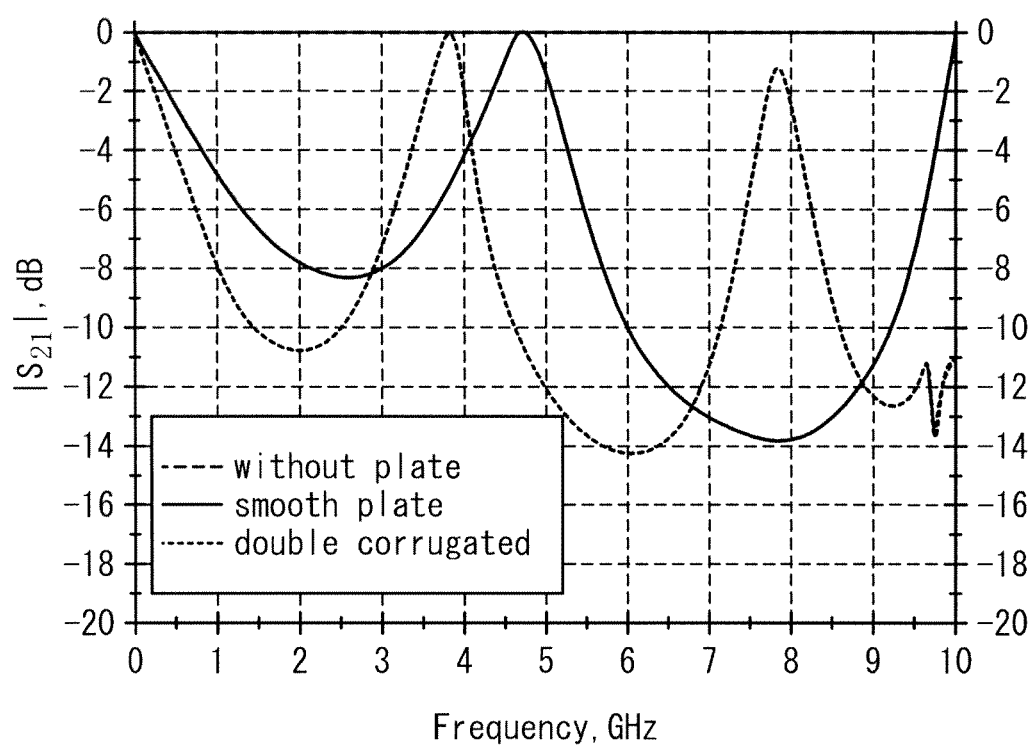
FIG. 6 is a graph showing the effect of the double-corrugated plates on the electrical performance of the resonant element by means of simulated insertion losses.
Figure 7A:
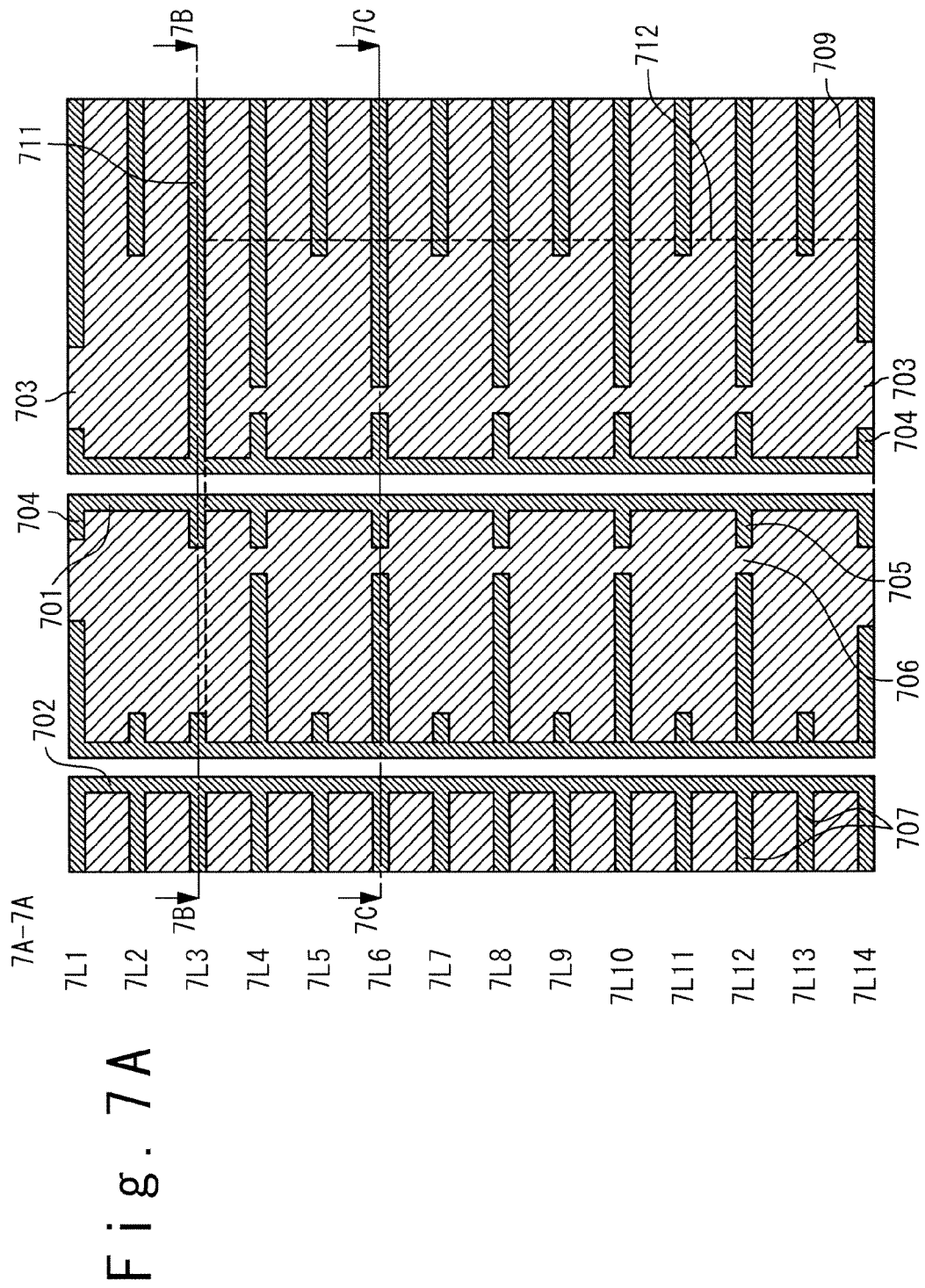
FIG. 7A is a vertical cross-sectional view illustrating a filter with a resonant stub element in an exemplary embodiment of the present invention.
Figure 7B:
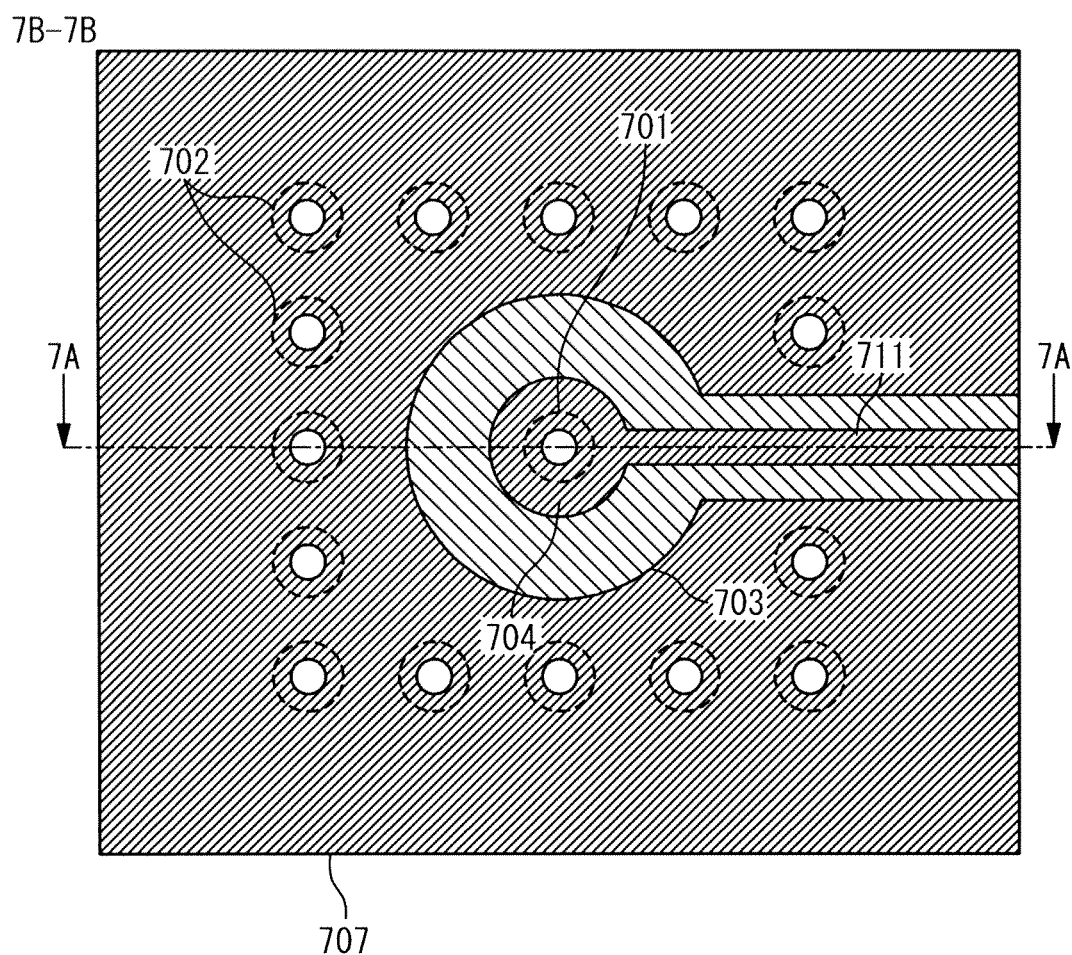
FIG. 7B is a horizontal cross-sectional view of the filter shown in FIG. 7A on the 7B section.
Figure 7C:
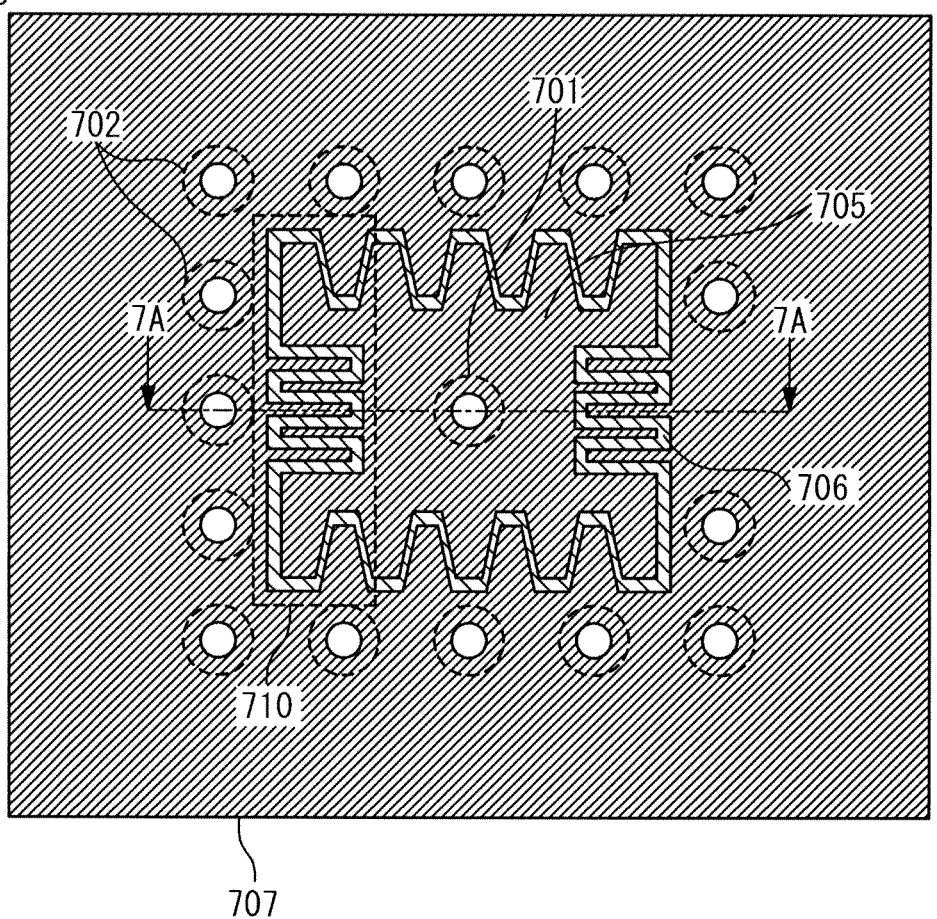
FIG. 7C is a horizontal cross-sectional view of the filter shown in FIG. 7A on the 7C section.
Figure 7D:
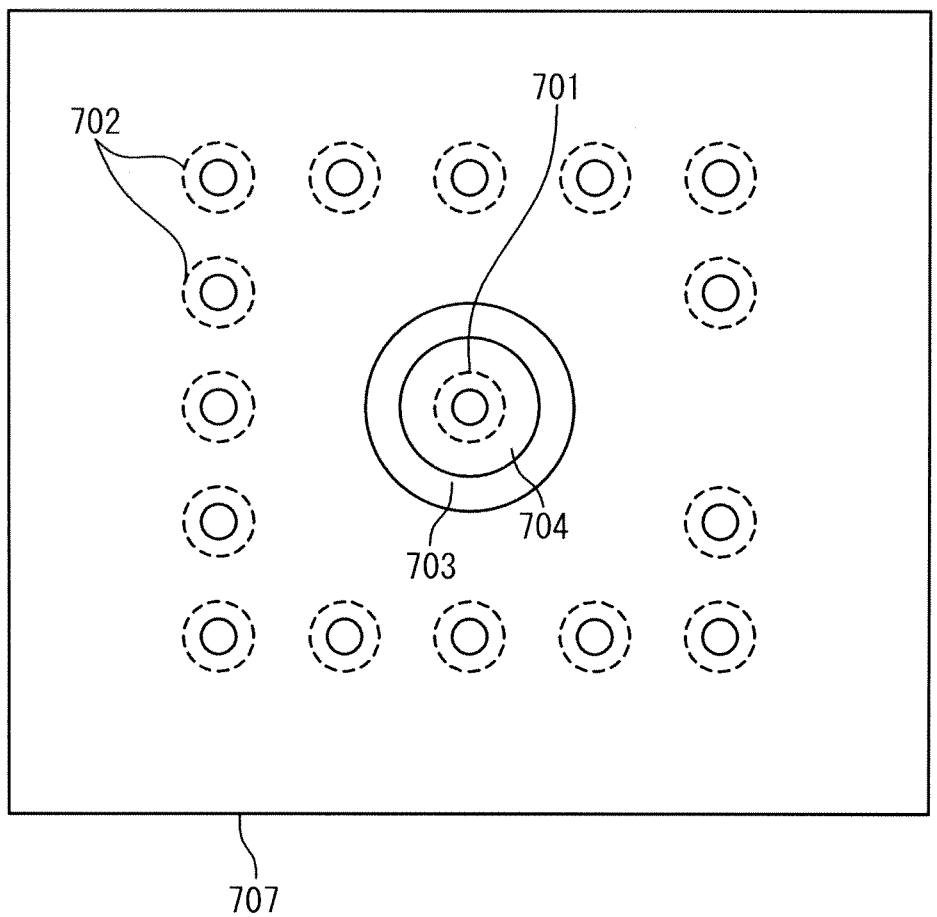
FIG. 7D is top and bottom views of the filter shown in FIG. 7A.
Figure 8A:
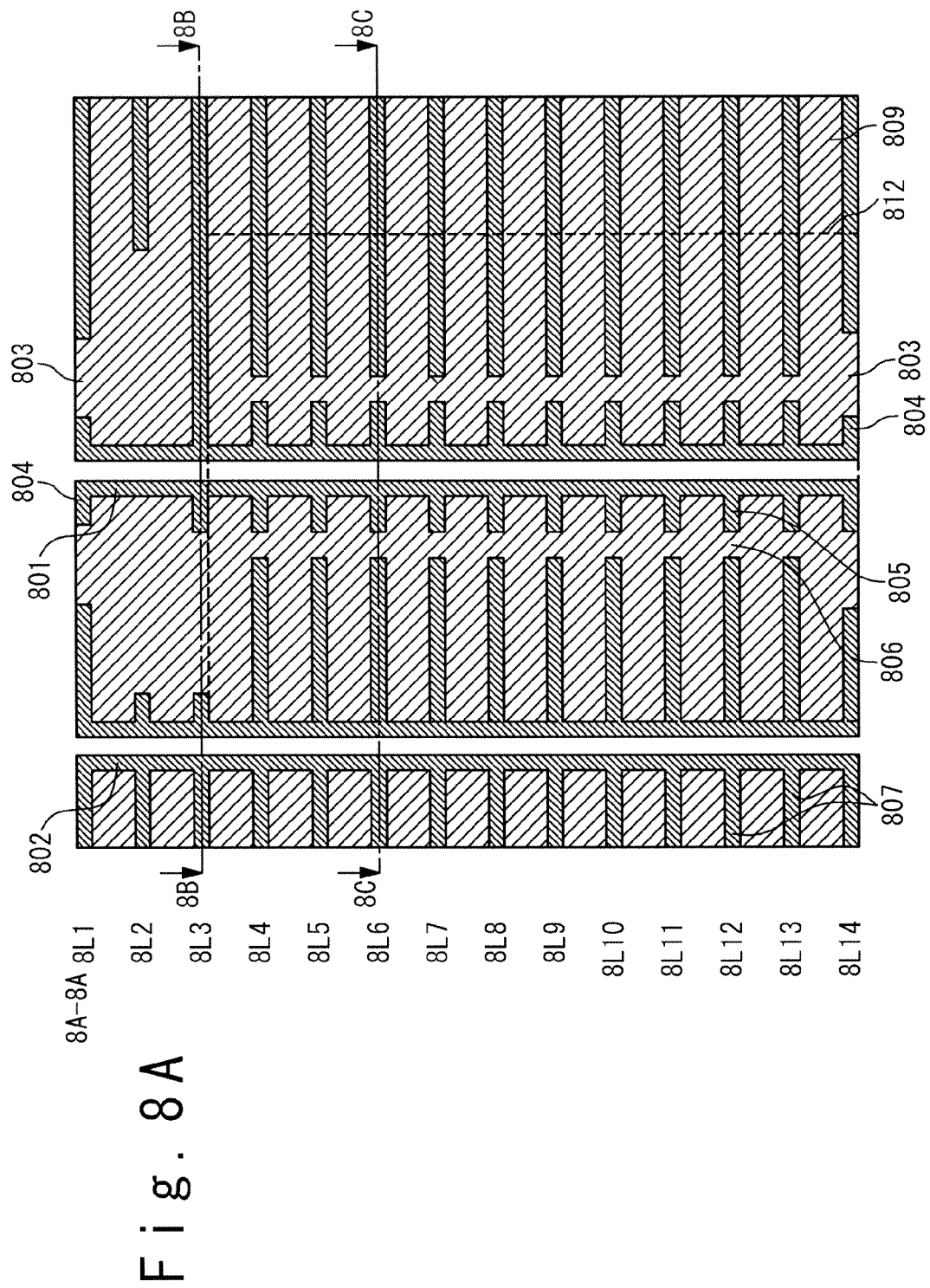
FIG. 8A is a vertical cross-sectional view illustrating a filter with a resonant stub element in an exemplary embodiment of the present invention.
Figure 8B:
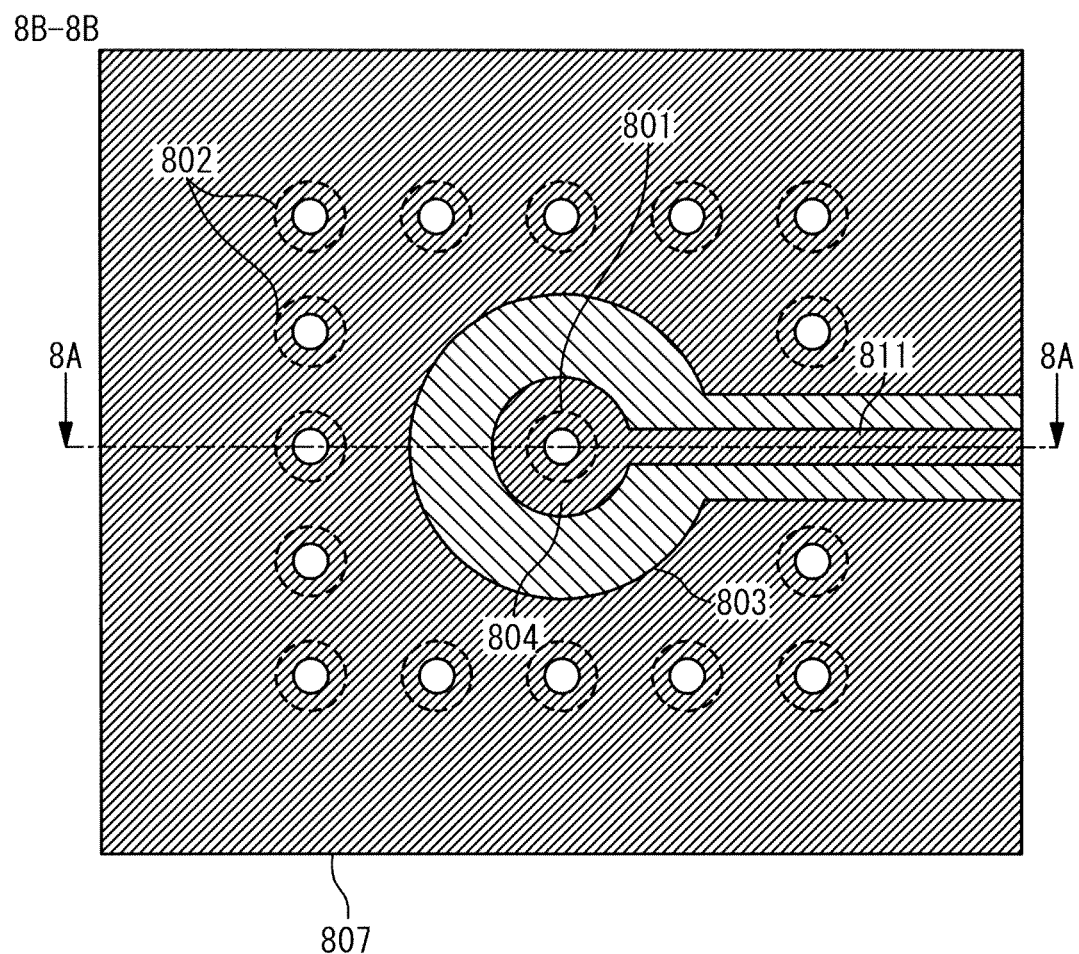
FIG. 8B is a horizontal cross-sectional view of the filter shown in FIG. 8A on the 8B section.
Figure 8C:
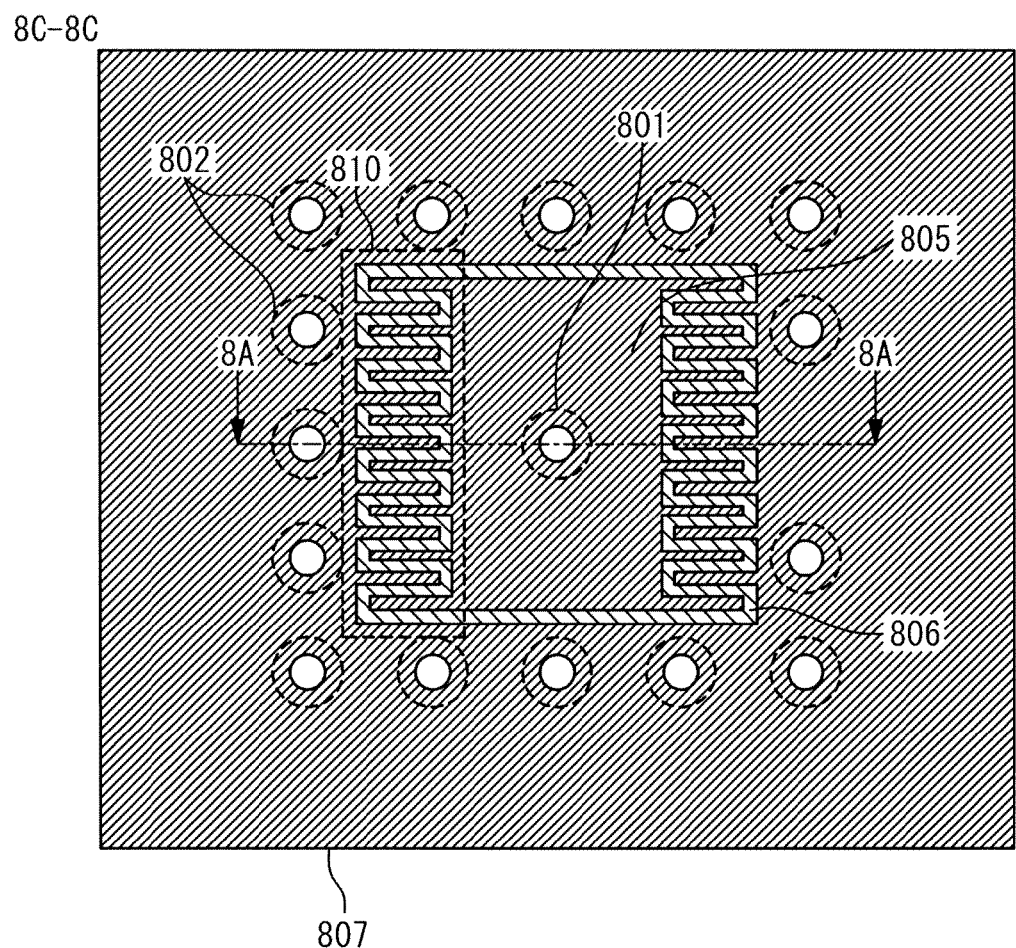
FIG. 8C is a horizontal cross-sectional view of the filter shown in FIG. 8A on the 8C section.
Figure 8D:
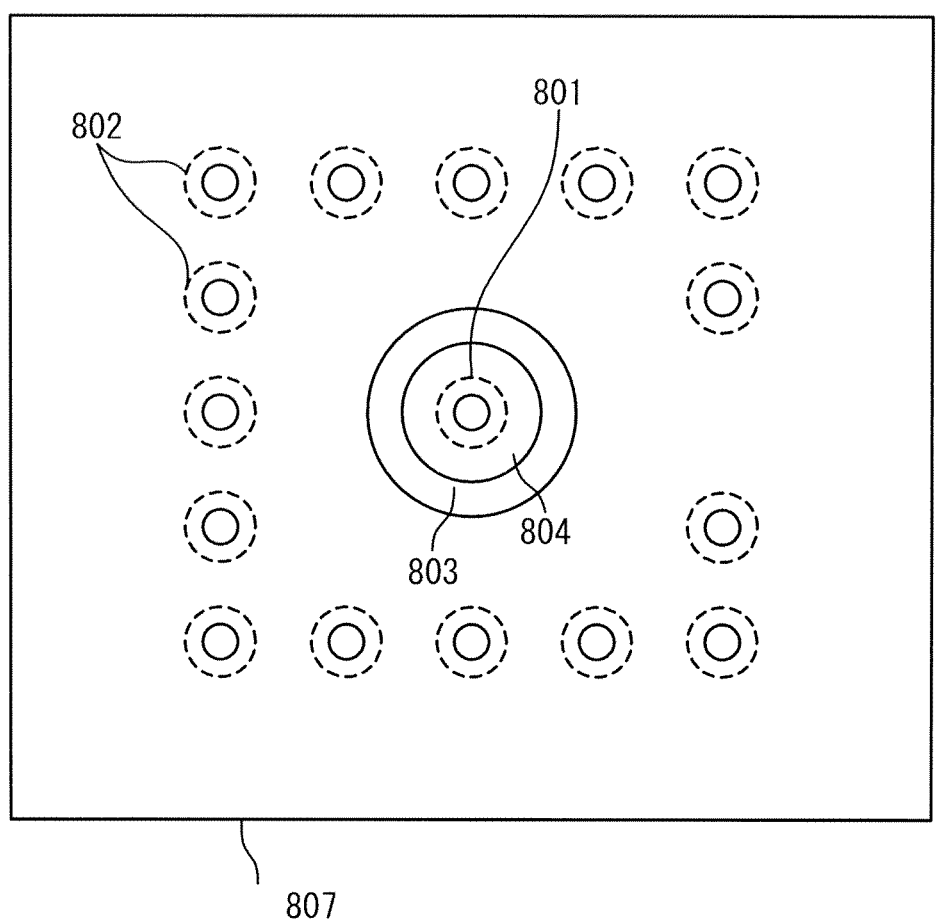
FIG. 8D is top and bottom views of the filter shown in FIG. 8A.

In FIGS. 5 and 6, simulation data for presented three cases are shown by means of return and insertion losses, spectively, in the frequency band up to 10 GHz.

Thus, if there is only the coaxial transmission line (this case is shown in FIGS. 2A-2C), then signal is propagating between top and bottom pads with low losses, that is, there are no resonance effects in this coaxial transmission line segment (corresponding curve is marked as "without plate" in FIGS. 5 and 6).

The application of the plates connected to the signal via conductor leads to another behavior of the coaxial transmission line segment. This effect is presented in FIGS. 5 and 6 by the curve indicated as "smooth plate." As one can see, resonance effect appears for the structure shown in FIGS. 3A-3C at the frequency of about 4.7 GHz. The electrical performance of the invented resonant element shown in FIGS. 4A-4C is presented in FIGS. 5 and 6 by the curve marked as "double-corrugated." For this element, the first resonance frequency is at about 3.7 GHz.

As follows from simulation results, the application of the double-corrugated surface shifts the position of the resonant frequency to the lower frequency. This means that the shorter length of the coaxial transmission line is required for the case of the double-corrugated surfaces to satisfy the same resonance conditions as for the smooth conductor plates.

Thus, the application of a double-corrugated surface in the area between signal and ground vias gives more compact resonant elements.

Here an exemplary embodiment of a filter which comprises an invented resonant element is presented in FIGS. 7A to 7D.

In this filter, the invented resonant element is used to obtain a resonance stub.

In FIGS. 7A-7D, the filter comprises the coaxial transmission line, planar transmission line 711 and resonant element 712 forming the stub as a part of the coaxial transmission line in a fourteen-conductor-layer board.

The coaxial transmission line comprises a signal via conductor 701, pads 704 connected to the signal via conductor 701, ground vias 702 connected to ground plates 707, and clearance area 703 isolating signal conductors from ground conductors.

A planar transmission line 711 is formed as a coplanar waveguide in which the signal trace is shielded by ground plates at the same conductor layer 7L3. One end of the planar transmission line is connected to the coaxial transmission line by means of the pad 704 and another end is a terminal of the filter. It should be noted that pad 704 formed at top conductor layer 7L1 is another terminal of the filter.

The stub is formed by means of the resonant element 712 which is obtained in the part of the coaxial transmission line disposed in the vertical direction from the planar transmission line to the pad 704 at the bottom conductor layer 7L14. This resonant element includes the signal via conductor 701, ground vias 702 connected to ground plates 707, pad 704 disposed at the bottom conductor layer 7L14, and double-corrugated surfaces 710 arranged in the area between signal via 701 and ground vias 702. This double-corrugated surface comprises ground plates 707 and signal plates 705 which are separated by isolating slits 706.

It should be noted that the form of corrugations in the double-corrugated surface can be different that is dependent on applications. In FIGS. 7A-7D, both rectangular and trapezoidal shapes of corrugations are used.

In FIGS. 8A to 8D, another exemplary embodiment of the filter using invented resonant element is shown. The construction of this filter similar to that shown in FIGS. 7A-7D but the resonant element comprises the same double corrugated surfaces 810 disposed at conductor layers 8L4, 8L5, 8L6, 8L7, 8L8, 8L9, 8L10, 8L11, 8L12, and 8L13. Ground plates 807 have corrugations of the rectangular form and signal plates 805 have also corrugations of the rectangular form. These plates are separated by isolating slits 806.

Figure 9:
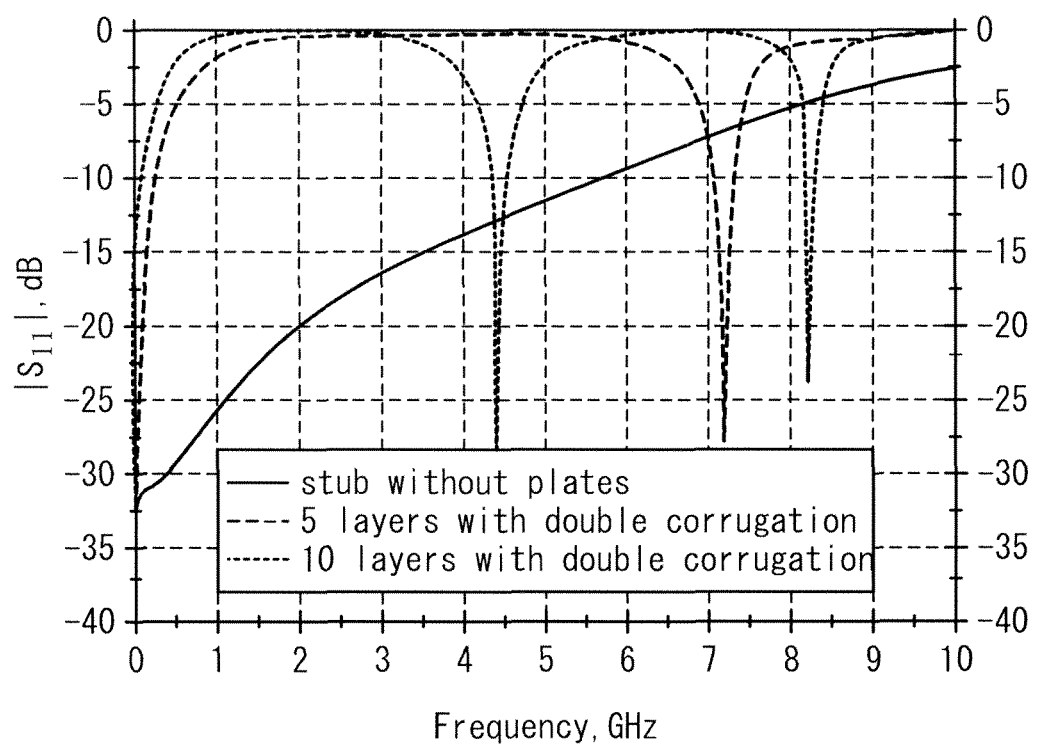
FIG. 9 is a graph showing the effect of the double-corrugated plates on the electrical performance of the filter by means of simulated return losses.
Figure 10:
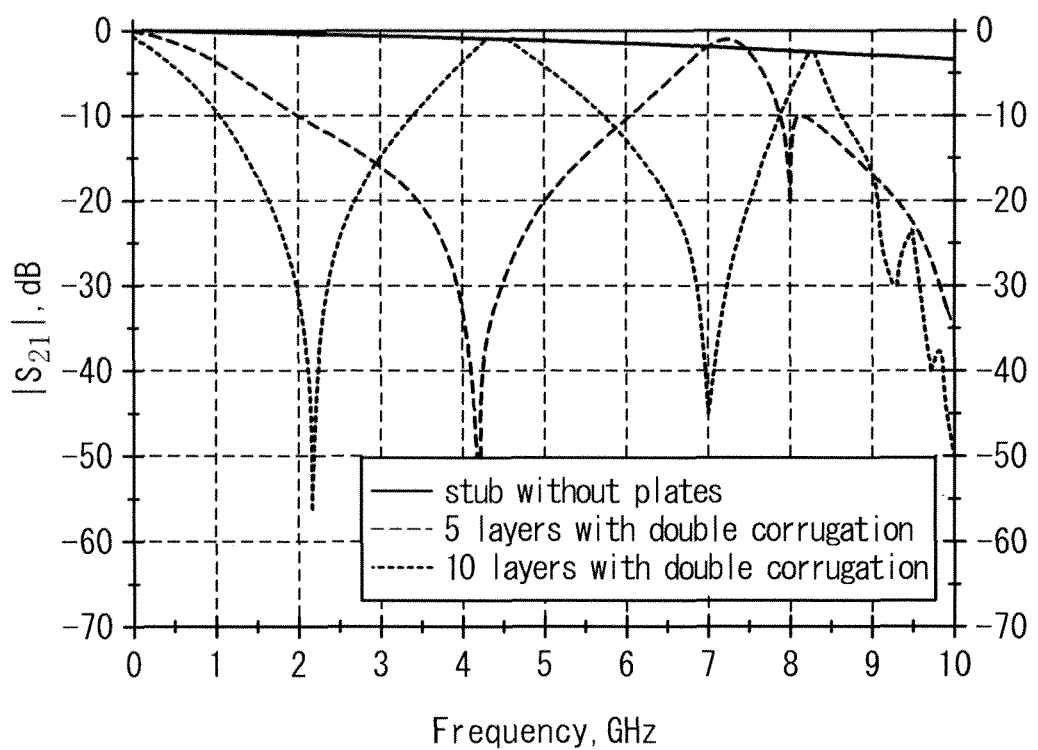
FIG. 10 is a graph showing the effect of the double-corrugated plates on the electrical performance of the filter by means of simulated insertion losses.

The electrical performance of the filter shown in FIGS. 8A-8D is presented in FIGS. 9 and 10 by means of return and insertion losses, respectively. The characteristics of this filter are indicated as "10 layers with double-corrugation."

To show effect of a number of double-corrugated surfaces on the frequency response, the parameters of another filter were calculated and are marked in FIGS. 9 and 10 as "5 layers with double-corrugation." The structure and dimensions of this filter are the same as in previous case but only five conductor layers, instead ten conductor layers, are used in the resonant element.

Also in FIGS. 9 and 10, the structure in which there are no conductor plates connected to the signal vias is presented and indicated as "stub without plates." The stub in this structure is similar to the configuration shown in FIGS. 2A-2C.

As one can conclude from FIGS. 9 and 10, the use of the double corrugated surfaces in the resonant element forming the stub is an important factor to obtain resonance effect and, as result, the filter. If there are no double-corrugated surfaces, then the structure loses the filtering properties.

Also a number of double-corrugated surfaces are a clearly-expressed parameter to control the position of the resonance in the frequency domain.

It is well understandable that different types of multilayer boards such as printed circuit boards, packages, interposers for example can be used to form presented resonant elements. Moreover, these resonant elements can be applied as both open-circuited stubs and short-circuited stubs to obtain a required filtering component.

While the present invention has been described in relation to some exemplary embodiments, it is to be understood that these exemplary embodiments are for the purpose of description by example, and not of limitation. While it will be obvious to those skilled in the art upon reading the present specification that various changes and substitutions may be easily made by equal components and art, it is obvious that such changes and substitutions lie within the true scope and spirit of the presented invention as defined by the claims.

The invention claimed is:

1. A resonant element, comprising:
   a multilayer board, comprising a plurality of conductor layers isolated by a dielectric;
   a signal via conductor, penetrating through said multilayer board; and
   a plurality of ground vias, penetrating through said multilayer board and disposed around said signal via conductor,
   wherein said multilayer board comprises:
   a first conductor layer;
   a second conductor layer; and
   a corrugated conductor layer disposed between said first and said second conductor layers,
   wherein said corrugated conductor layer comprises:
   a corrugated signal plate, connected to said signal via conductor; and a corrugated ground plate, connected to said plurality of ground vias, isolated from said corrugated signal plate by said dielectric, wherein an artificial medium is formed between said signal via conductor and said ground vias, and wherein said corrugated signal plate and said corrugated ground plate define a double corrugation that controls a permittivity of the artificial medium.

2. The resonant element according to claim 1, wherein said first conductor layer comprises:
a first pad, connected to said signal via conductor; and
a first clearance area, separating said first pad from another conductor disposed on said first conductor layer,
wherein said second conductor layer comprises:
a second pad, connected to said signal via conductor; and
a second clearance area separating said second pad from another conductor disposed on said second conductor layer.

3. The resonant element according to claim 2, wherein said corrugated signal plate comprises:
a corrugation with a rectangular form.

4. A filter, comprising:
the resonant element according to claim 2; and
a third conductor layer, disposed over said first conductor layer and isolated from said first conductor layer by said dielectric,
wherein said first conductor layer further comprises a planar transmission line, connected to said signal via conductor.

5. The filter according to claim 4, wherein said first conductor layer further comprises a second ground plate connected to said plurality of ground vias and isolated from said planar transmission line by said dielectric.

6. The resonant element according to claim 1, wherein said corrugated signal plate comprises:
a corrugation with a rectangular form.

7. The resonant element according to claim 1, wherein a signal wave propagates along said signal via conductor and said ground vias that is perpendicular to said signal plate and said ground plate.

8. The resonant element according to claim 1, wherein a double corrugated surface is formed in an area between said signal via conductor and said ground vias.

9. The resonant element according to claim 8, wherein the double corrugated surface comprises the corrugated signal plate connected to the signal via conductor and said corrugated ground plate connected to the ground vias.

10. The resonant element according to claim 9, further comprising an isolating slit disposed in the double corrugated surface, the isolating slit separating the signal plate from the ground plate.

11. The resonant element according to claim 1, wherein said first conductor layer further comprises:
a planar transmission line connected to said signal via conductor.

12. The resonant element according to claim 11, wherein said first conductor layer further comprises:
a second ground plate, connected to said plurality of ground vias and isolated from said planar transmission line.

13. The resonant element according to claim 12, wherein said dielectric isolates the second ground plate from said planar transmission line.

14. A resonant element, comprising:
a multilayer board, comprising a plurality of conductor layers isolated by a dielectric;
a signal via conductor, penetrating through said multilayer board; and
a plurality of ground vias, penetrating through said multilayer board and disposed around said signal via conductor,
wherein said multilayer board comprises:
a first conductor layer;
a second conductor layer; and
a corrugated conductor layer disposed between said first and said second conductor layers,
wherein said corrugated conductor layer comprises:
a corrugated signal plate, connected to said signal via conductor; and
a corrugated ground plate, connected to said plurality of ground vias, isolated from said corrugated signal plate by said dielectric, and
wherein said corrugated signal plate comprises:
a corrugation with a trapezoidal form.

15. A filter, comprising:
a resonant element, comprising:
a multilayer board, comprising a plurality of conductor layers isolated by a dielectric;
a signal via conductor, penetrating through said multilayer board; and
a plurality of ground vias, penetrating through said multilayer board and disposed around said signal via conductor,
wherein said multilayer board comprises:
a first conductor layer;
a second conductor layer; and
a corrugated conductor layer disposed between said first and said second conductor layers,
wherein said corrugated conductor layer comprises:
a corrugated signal plate, connected to said signal via conductor; and
a corrugated ground plate, connected to said plurality of ground vias, isolated from said corrugated signal plate by said dielectric
wherein said first conductor layer comprises:
a first pad, connected to said signal via conductor; and
a first clearance area, separating said first pad from another conductor disposed on said first conductor layer,
wherein said second conductor layer comprises:
a second pad, connected to said signal via conductor; and
a second clearance area separating said second pad from another conductor disposed on said second conductor layer,
wherein said filter further comprises:
a third conductor layer, disposed over said first conductor layer and isolated from said first conductor layer by said dielectric,
wherein said first conductor layer further comprises:
a planar transmission line, connected to said signal via conductor; and
a second ground plate, connected to said plurality of ground vias and isolated from said planar transmission line by said dielectric,
wherein said third conductor layer comprises:
a third pad, connected to said signal via conductor; and
a third ground plate, connected to said plurality of ground vias; and
a third clearance area, separating said third pad from another conductor disposed on said third conductor layer, and wherein said resonant element serves as a resonant stub connected between said planar transmission line and said third pad.

16. The filter according to claim 15, wherein said corrugated signal plate comprises:
   a corrugation with a rectangular form.

17. The filter according to claim 15, wherein said corrugated signal plate comprises:
   a corrugation with a trapezoidal form.

18. A resonant element, comprising:
   a multilayer board, comprising a plurality of conductor layers isolated by a dielectric;
   a signal via conductor, penetrating through said multilayer board; and
   a plurality of ground vias, penetrating through said multilayer board and disposed around said signal via conductor,
   wherein said multilayer board comprises:
      a first conductor layer;
      a second conductor layer; and
      a corrugated conductor layer disposed between said first and said second conductor layers,
   wherein said corrugated conductor layer comprises:
      a corrugated signal plate, connected to said signal via conductor; and
      a corrugated ground plate, connected to said plurality of ground vias, isolated from said corrugated signal plate by said dielectric
   wherein said first conductor layer comprises:
      a first pad, connected to said signal via conductor; and
      a first clearance area, separating said first pad from another conductor disposed on said first conductor layer,
   wherein said second conductor layer comprises:
      a second pad, connected to said signal via conductor; and
      a second clearance area separating said second pad from another conductor disposed on said second conductor layer, and
   wherein said corrugated signal plate comprises:
      a corrugation with a trapezoidal form.

* * * * *